(12) United States Patent
Hsieh et al.

(10) Patent No.: US 11,187,248 B2
(45) Date of Patent: Nov. 30, 2021

(54) FAN AND BALANCE RING FOR FAN

(71) Applicant: Acer Incorporated, New Taipei (TW)

(72) Inventors: Cheng-Wen Hsieh, New Taipei (TW); Wen-Neng Liao, New Taipei (TW); Chun-Chieh Wang, New Taipei (TW); Yu-Ming Lin, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 80 days.

(21) Appl. No.: 16/392,893

(22) Filed: Apr. 24, 2019

(65) Prior Publication Data

US 2019/0331135 A1 Oct. 31, 2019

(30) Foreign Application Priority Data

Apr. 26, 2018 (TW) ................................ 107114233

(51) Int. Cl.
*F04D 29/66* (2006.01)
*F04D 17/16* (2006.01)
*H05K 7/20* (2006.01)
*G06F 1/20* (2006.01)

(52) U.S. Cl.
CPC ........... *F04D 29/662* (2013.01); *F04D 17/16* (2013.01); *H05K 7/20172* (2013.01); *G06F 1/203* (2013.01); *G06F 2200/201* (2013.01)

(58) Field of Classification Search
CPC ...... F04D 29/662; F04D 29/668; F04D 17/16; H05K 7/20172; G06F 1/203; G06F 2200/201
See application file for complete search history.

(56) References Cited

U.S. PATENT DOCUMENTS

| 2,836,083 | A | * | 5/1958 | Smith | D06F 37/245 |
| | | | | | 74/572.4 |
| 4,388,841 | A | * | 6/1983 | Gamble | D06F 37/245 |
| | | | | | 24/369 |
| 5,256,037 | A | * | 10/1993 | Chatelain | F04D 29/662 |
| | | | | | 310/51 |
| 5,380,156 | A | * | 1/1995 | Iacovino | F04D 29/662 |
| | | | | | 416/144 |

(Continued)

FOREIGN PATENT DOCUMENTS

| CN | 1771651 A | 5/2006 |
| CN | 106768642 A | 5/2017 |

(Continued)

OTHER PUBLICATIONS

Chinese language office action dated May 28, 2020, issued in application No. CN 201810558161.0.

(Continued)

*Primary Examiner* — Woody A Lee, Jr.
*Assistant Examiner* — Brian O Peters
(74) *Attorney, Agent, or Firm* — McClure, Qualey & Rodack, LLP

(57) ABSTRACT

A fan and a balance ring for the fan are provided. The fan includes a housing, a hub disposed in the housing, blades connected to the side surface of the hub, and a balance ring connected to the hub. The balance ring includes a ring chamber and a balance liquid filled in the ring chamber. The volume of the balance liquid is less than the volume of the ring chamber.

23 Claims, 8 Drawing Sheets

(56) References Cited

U.S. PATENT DOCUMENTS

| | | | |
|---|---|---|---|
| 5,503,464 A | 4/1996 | Collura | |
| 5,593,281 A * | 1/1997 | Tai .................. | F04D 25/088 |
| | | | 416/145 |
| 6,373,154 B1 * | 4/2002 | Sohn ................ | F16F 15/363 |
| | | | 310/51 |
| 7,717,679 B2 * | 5/2010 | He .................. | F04D 25/0613 |
| | | | 416/144 |
| 2001/0035068 A1 | 11/2001 | Case et al. | |
| 2012/0144875 A1 | 6/2012 | Kim et al. | |

FOREIGN PATENT DOCUMENTS

| | | |
|---|---|---|
| GB | 2 417 616 B | 1/2008 |
| TW | M446052 U1 | 2/2013 |
| WO | 2008/051534 A2 | 5/2008 |

OTHER PUBLICATIONS

Chinese language office action dated Nov. 21, 2018, issued in application No. TW 107114233.

* cited by examiner

FAN AND BALANCE RING FOR FAN

CROSS-REFERENCE TO RELATED APPLICATIONS

This Application claims priority of Taiwan Patent Application No. 107114233 filed on Apr. 26, 2018, the entirety of which is incorporated by reference herein.

BACKGROUND OF THE INVENTION

Field of the Invention

The present disclosure relates to a fan and a balance ring, and in particular to a fan having a balance ring or a balance ring for a fan.

Description of the Related Art

In general, a heat-dissipation fan is disposed in a laptop computer to exhaust the heat in the laptop computer. However, due to the high demand for the performance of the laptop computer, the excessive heat is generated, so the speed of the heat-dissipation fan is increased to increase the heat dissipation efficiency of the laptop computer.

However, the fan operated in excessively high speed increases the noise and vibration generated by the fan, which in turn affects the comfort of the user when using the laptop computer. Moreover, in order to reduce the noise generated by the fan operated high speed, the rotation speed of the fan is generally reduced when the laptop computer is operated in low speed, and the rotation speed of the fan is generally increased when the laptop computer is operated in high speed. However, when the fan accelerates or decelerates, it will also generate large noise and vibration due to the imbalance caused by the impeller rotation.

Accordingly, although existing fans have been generally adequate for their intended purposes, they have not been entirely satisfactory in all respects. Consequently, it would be desirable to provide a solution for improving fans.

BRIEF SUMMARY OF THE INVENTION

The present disclosure provides a fan and a balance ring. The balance ring is used to increase the stability of the fan during operation, so as to reduce the noise and vibration of the fan.

The present disclosure provides a fan including a housing, a hub, blades and a balance ring. The hub is disposed in the housing, and includes a side surface, a top surface and a drive groove. When the hub is rotated, the hub is rotated about a central axis. The central axis passes through the top surface and the drive groove. The blade is connected to the side surface. The balance ring is connected to the hub, and includes a ring chamber surrounding the central axis and a balance liquid filled in the ring chamber. The volume of the balance liquid is less than the volume of the ring chamber.

In some embodiments, the balance ring is disposed in the drive groove. In some embodiments, the balance ring is disposed on the top surface. In some embodiments, the hub includes a retaining groove formed on the top surface, and the balance ring is disposed in the retaining groove. In some embodiments, the fan further includes a retaining structure disposed on the hub, and the balance ring is retained on the hub via the retaining structure.

In some embodiments, the greatest diameter of the hub is about 1 time to 1.3 times the greatest diameter of the balance ring. The greatest thickness of the hub is about 1 time to 8 times the greatest thickness of the balance ring.

The present disclosure provides a balance ring for a fan including a sealing body. The sealing body includes a ring chamber and a balance liquid filled in the ring chamber. The volume of the balance liquid is less than the volume of the ring chamber.

In some embodiments, the sealing body and the ring chamber are circular. The sealing body and the ring chamber extend along the same circular path.

In some embodiments, the ring chamber includes a first curved surface and a second curved surface opposite to the first curved surface. In some embodiments, the cross sections of the first curved surface and the second curved surface are semicircular.

In some embodiments, the ring chamber includes a top plane and a bottom plane opposite to the top plane. The top plane and the bottom plane are connected to the first curved surface and the second curved surface.

In some embodiments, the volume of the balance liquid is about 0.2 times to 0.8 times the volume of the ring chamber. The balance ring includes plastic. The balance liquid includes hydrofluoroether. The balance liquid has a surface tension coefficient, which is less than 50 dyne/cm at 20° C.

In conclusion, the fan of the present disclosure can increase the stability of the fan rotation by the balance ring, thereby reducing the vibration or noise generated by the fan operation.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
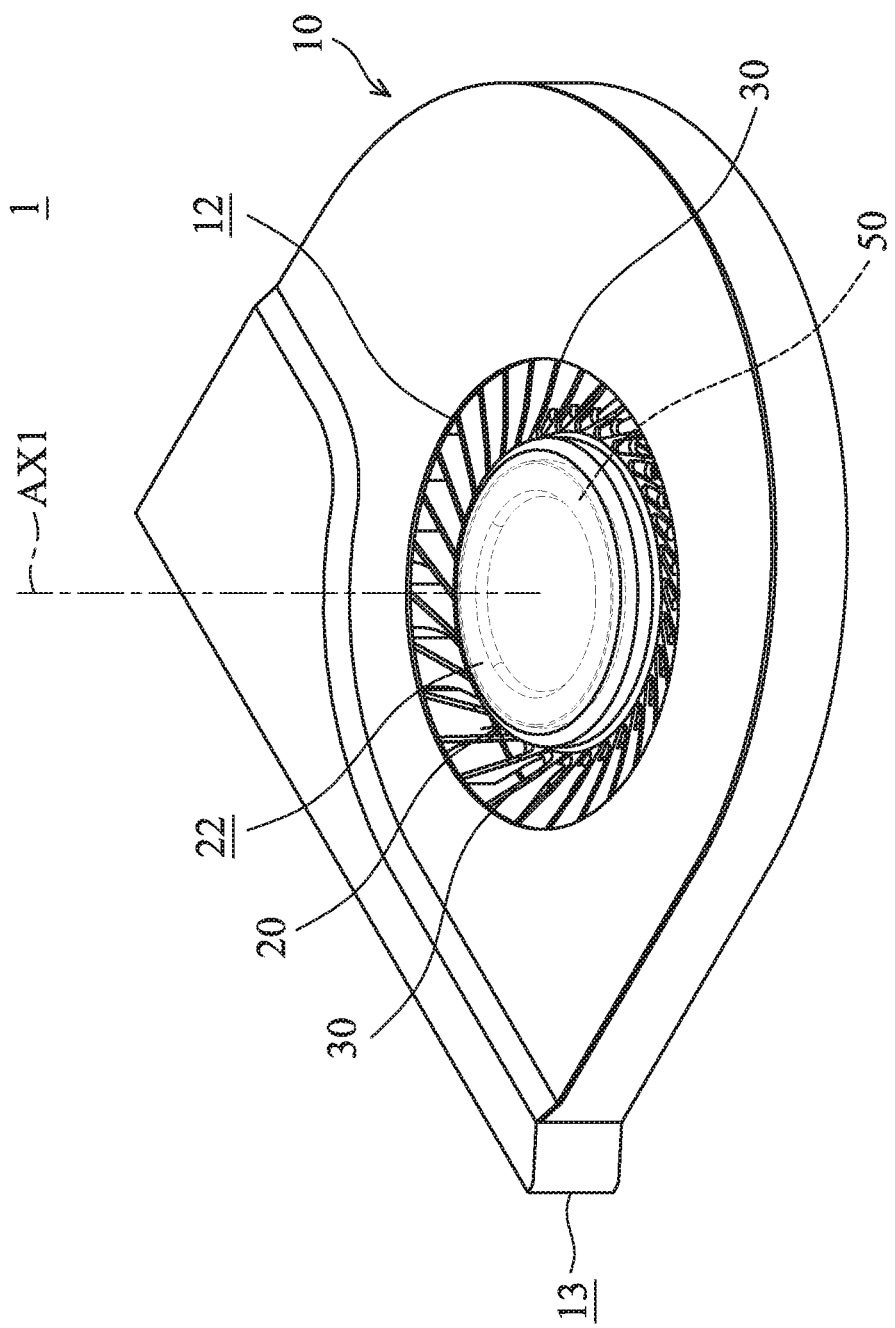
FIG. 1 is a perspective view of a fan in accordance with a first embodiment of the disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. Moreover, the shape, size, thickness, and tilt angle depicted in the drawings may not be drawn to scale or may be simplified for clarity of discussion; these drawings are merely intended for illustration.

Figure 2:
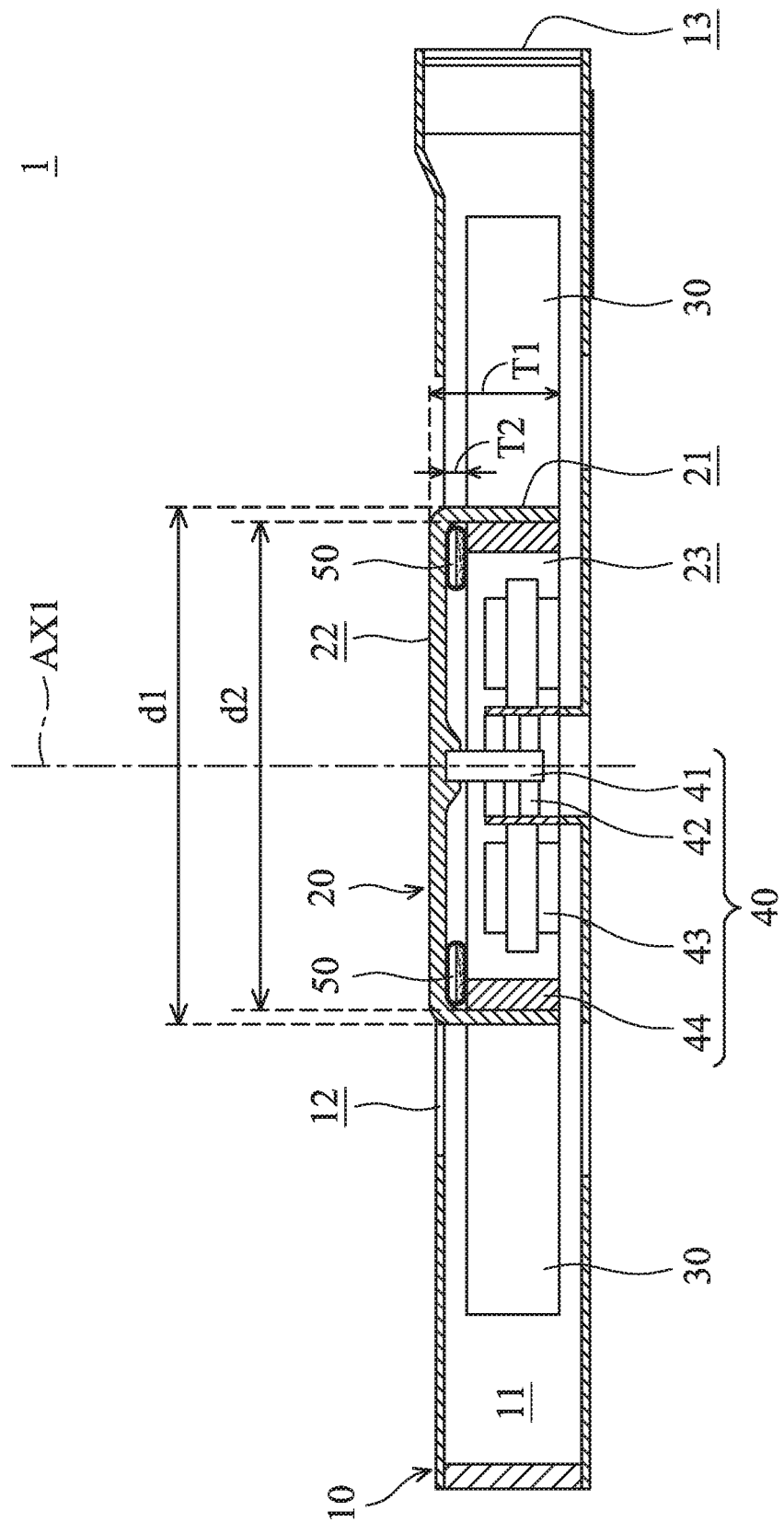
FIG. 2 is a cross-sectional view of the fan in accordance with the first embodiment of the disclosure.

FIG. 1 is a perspective view of a fan 1 in accordance with a first embodiment of the disclosure. FIG. 2 is a cross-sectional view of the fan 1 in accordance with the first embodiment of the disclosure. The fan 1 can be installed on an electronic device, such as a notebook computer, a personal computer, or a server. The fan 1 may be a centrifugal fan or an axial fan, but it is not limited thereto. In this embodiment, the fan 1 may be a centrifugal fan.

The fan 1 includes a housing 10, a hub 20, blades 30, a drive mechanism 40, and a balance ring 50. The housing 10 has a receiving space 11, an inlet 12 and an outlet 13. The receiving space 11 is connected to the inlet 12 and the outlet 13. The inlet 12 corresponds to the hub 20. The outlet 13 is located on a side surface 21 of the housing 10, and corresponds to the blade 30.

The hub 20 is disposed in the housing 10, and includes a side surface 21, a top surface 22, and a drive groove 23. When the hub 20 is rotated, the hub 20 is rotated about a central axis AX1. The central axis AX1 passes through the top surface 22 and the drive groove 23. In this embodiment, the central axis AX1 passes through the center of the top surface 22, and perpendicular to the top surface 22. The side surface 21 surrounds the central axis AX1.

The blade 30 is connected to the side surface 21 of the hub 20. In this embodiment, the blades 30 extend radially from the side surface 21 and arranged on the side surface 21 of the hub 20 at intervals. In some embodiments, the materials of the hub 20 and the blade 30 are plastic. The hub 20 and the blade 30 may be formed as a single piece.

The drive mechanism 40 is disposed in the drive groove 23 of the hub 20, and connected to the hub 20 and the housing 10. The drive mechanism 40 is configured to rotate the hub 20, so as to make the blades 30 generate airflow. In this embodiment, the airflow can enter the housing 10 via the inlet 12 of the housing 10, and is exhausted from the housing 10 via the outlet 13.

In some embodiments, the outlet 13 corresponds to a heat source (not shown in figures). The airflow generated by the outlet 13 is blown to the heat source, so as to lower the temperature of the heat source. The heat source may be heat-dissipation fins or electronic components, such as chips.

The drive mechanism 40 includes a rotation shaft 41, a bearing 42, a stator 43, and a rotator 44. The rotation shaft 41 is located in the drive groove 23, and one end of the rotation shaft 41 is affixed to the hub 20. The rotation shaft 41 extends along the central axis AX1. The bearing 42 is affixed to the housing 10, and located in the receiving space 11. The bearing 42 surrounds the rotation shaft 41, and is in contact with the rotation shaft 41. The rotation shaft 41 is rotatably disposed in the bearing 42.

The stator 43 is affixed to the housing 10, and located in the receiving space 11. The rotator 44 is affixed to the hub 20, and located in the drive groove 23. The rotator 44 is separated from the stator 43. The stator 43 may be an electromagnet, and the rotator 44 may be a permanent magnet. The stator 43 rotates the rotator 44 by the magnetic force generated between the stator 43 and the rotator 44, thereby driving the hub 20 and the blade 30 to rotate.

Figure 3:
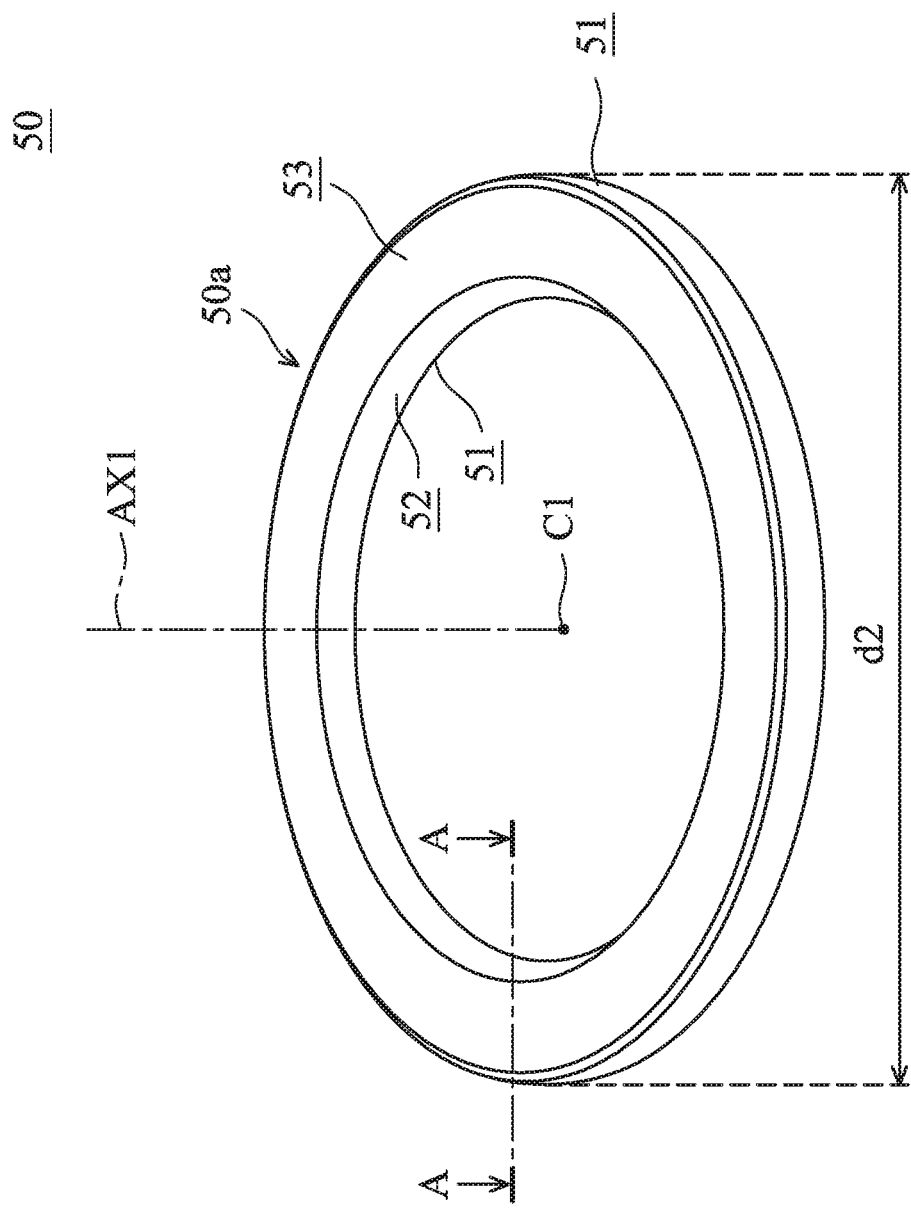
FIG. 3 is a perspective view of the balance ring in accordance with some embodiments of the disclosure.

FIG. 3 is a perspective view of the balance ring 50 in accordance with some embodiments of the disclosure. In this embodiment, the balance ring 50 is connected to the hub 20, and located in the drive groove 23. Moreover, the balance ring 50 is located between the hub 20 and the rotator 44. Therefore, the balance ring 50 can be affixed to the hub 20 by the rotator 44. The balance ring 50 may extend a plane, which is perpendicular to the central axis AX1, and the central axis AX1 may pass through the center C1 of the balance ring 50. The balance ring 50 may be a circular, which surrounds the central axis AX1.

In some embodiments, the greatest diameter d1 of the hub 20 is about 1 to 1.3 times the greatest diameter d2 of the balance ring 50. The greatest thickness T1 of the hub 20 is about 1 to 8 times the greatest thickness T2 of the balance ring 50. The diameters d1 and d2 are measured in the same direction, which is perpendicular to the central axis AX1. The thicknesses T1 and T2 are measure in the same direction, which is parallel to the central axis AX1.

In some embodiments, the material of the balance ring 50 may be plastic, thereby reducing the weight of the balance ring 50 and reducing the difficulty of making the balance ring 50.

Figure 4B:
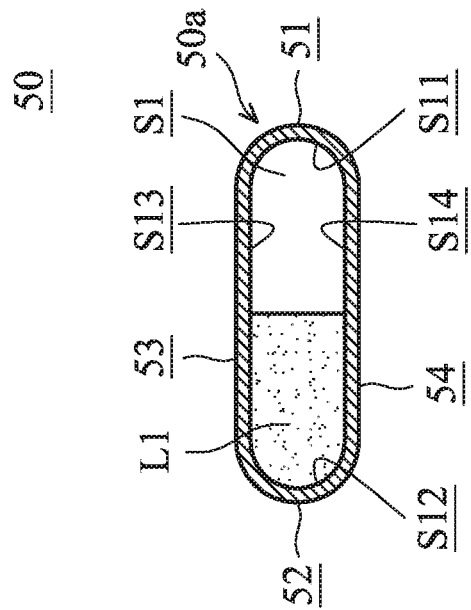
FIG. 4B is a cross-sectional view along the line AA of FIG. 3, wherein the balance ring is in a rotation state.
Figure 4A:
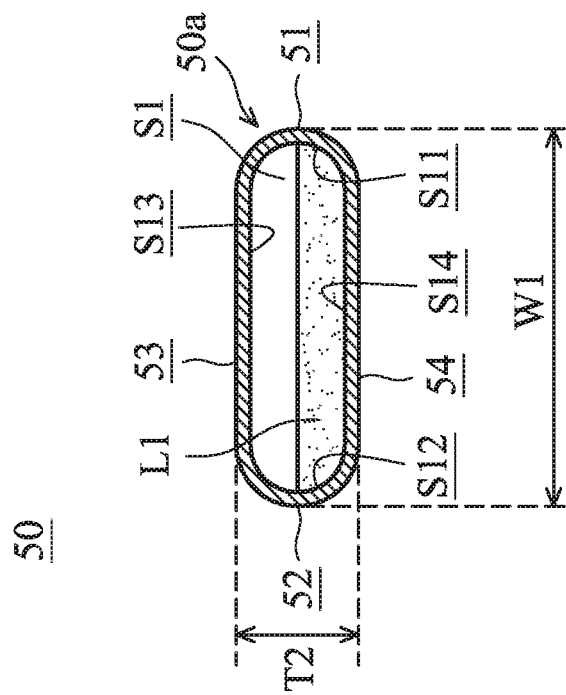
FIG. 4A is a cross-sectional view along the line AA of FIG. 3, wherein the balance ring is in a stationary state.

FIG. 4A is a cross-sectional view along the line AA of FIG. 3, wherein the balance ring 50 is in a stationary state. FIG. 4B is a cross-sectional view along the line AA of FIG. 3, wherein the balance ring 50 is in a rotation state. The balance ring 50 includes a sealing body 50a, a ring chamber S1, and a balance liquid L1. The sealing body 50a is connected to the hub 20, and located in the drive groove 23. The sealing body 50a extends a plane, which is perpendicular to the central axis AX1. The central axis AX1 may pass through the center C1 of the sealing body 50a. The sealing body 50a may be circular, which surrounds the central axis AX1.

In some embodiments, the greatest width W1 of the sealing body 50a is about 1 to 5 times the greatest thickness T2. In some embodiments, the materials of the sealing body 50a may be plastic, thereby reducing the weight of the sealing body 50a and reducing the difficulty of making the sealing body 50a.

The sealing body 50a includes a first outer surface 51, a second outer surface 52, a first outer plane 53, and a second outer plane 54. The first outer surface 51 is opposite to the second outer surface 52. The first outer plane 53 is opposite to the second outer plane 54, and the first outer plane 53 is parallel to the second outer plane 54. The first outer plane 53 and the second outer plane 54 are connected to the first outer surface 51 and the second outer surface 52.

The first outer surface 51, the second outer surface 52, the first outer plane 53, and the second outer plane 54 are ring-shaped. In this embodiment, the first outer surface 51, the second outer surface 52, the first outer plane 53, and the second outer plane 54 extends along circular paths.

The first outer surface 51 is adjacent to the central axis AX1 with respect to the second outer surface 52. In a cross section, which is parallel to and passes through the central axis AX1, the first outer surface 51 and the second outer surface 52 are curved. In some embodiments, in the cross section, which is parallel to and passes through the central axis AX1, the first outer surface 51 and the second outer surface 52 are semicircular.

In some embodiments, in the cross section, which is parallel to and passes through the central axis AX1, the first outer plane 53 and the second outer plane 54 are curved. In some embodiments, in the cross section, which is parallel to and passes through the central axis AX1, the first outer surface 51, the second outer surface 52, the first outer plane 53, and the second outer plane 54 are oval.

The ring chamber S1 is formed in the sealing body 50a. The ring chamber S1 may be circular, and the sealing body 50a and the ring chamber S1 may be extend along the same circular path. The ring chamber S1 includes a first curved surface S11, a second curved surface S12, a top plane S13, and a bottom plane S14. The second curved surface S12 is opposite to the first curved surface S11. The top plane S13 is relative to the bottom plane S14, and the top plane S13 is parallel to the bottom plane S14. The top plane S13 and the bottom plane S14 are connected to the first curved surface S11 and the second curved surface S12.

The first curved surface S11, the second curved surface S12, the top plane S13, and the bottom plane S14 are ring-shaped. In this embodiment, the first curved surface S11, the second curved surface S12, the top plane S13, and the bottom plane S14 extends along circular paths.

The first curved surface S11 is adjacent to the central axis AX1 with respect to the second curved surface S12. In the cross section, which is parallel to and passes through the central axis AX1, the cross sections of the first curved surface S11 and the second curved surface S12 are semicircular. In some embodiments, in the cross section, which is parallel to and passes through the central axis AX1, the ring chamber S1 is oval.

The balance liquid L1 is filled in the ring chamber S1. The volume of the balance liquid L1 is less than the volume of the ring chamber S1. The volume of the balance liquid L1 is about 0.2 times to 0.8 times the volume of the ring chamber S1. In some embodiments, the volume of the balance liquid L1 is about 0.5 times of the volume of the ring chamber S1.

The balance liquid L1 can be a liquid with low surface tension. In some embodiments, at 20° C., the surface tension coefficient of the balance liquid L1 is less than 50 dyne/cm. In some embodiments, the materials of the balance liquid L1 may be hydrofluoroether (HFE), but there are not limited thereto. In some embodiments, the materials of the balance liquid L1 may be hydrofluoroether, polyether ketone, polyethylene, benzene, acetone, methanol, ethanol, polytetrafluoroethylene, n-hexane, and/or n-pentane.

As shown in FIGS. 1, 2 and 4A, the central axis AX1 is perpendicular to a horizontal surface. When the hub 20 and the blade 30 are stationary, the balance liquid L1 within the ring chamber S1 is located at a stationary position. Moreover, the liquid level of the balance liquid L1 may be a horizontal surface. When the hub 20 and the blade 30 are rotated, the balance liquid L1 gradually flows from the stationary position of FIG. 4A to the equilibrium position of FIG. 4B. Since the second curved surface S12 is circular, the balance liquid L1 can smoothly flow from the stationary position to the equilibrium position, thereby reducing the vibration of the fan 1 caused by the flow of the balance liquid L1.

When the fan 1 continues to rotate, the balance liquid L1 located in the ring chamber S1 generates a moment of inertia. The moment of inertia can increase the stability of the fan 1 during operation, thereby reducing the vibration or noise generated by the fan 1. In some embodiments, when the fan 1 accelerates or rotates or the fan 1 is hit by an external force, the balance liquid L1 located in the ring chamber S1 can also stabilize the rotation of the hub 20 by the moment of inertia.

When the fan 1 is stopped from rotation, the rotational speeds of the hub 20 and the blade 30 gradually become smaller, and the balance liquid L1 is gradually changed from the equilibrium position of FIG. 4B to the stationary position of FIG. 4A. Since the first curved surface S11 is circular, the balance liquid L1 can smoothly flow from the equilibrium position to the stationary position. Therefore, the vibration of fan 1 caused by the balance liquid L1 flow can be reduced, and the vibration or noise generated by fan 1 can be reduced by the moment of inertia.

Figure 5:
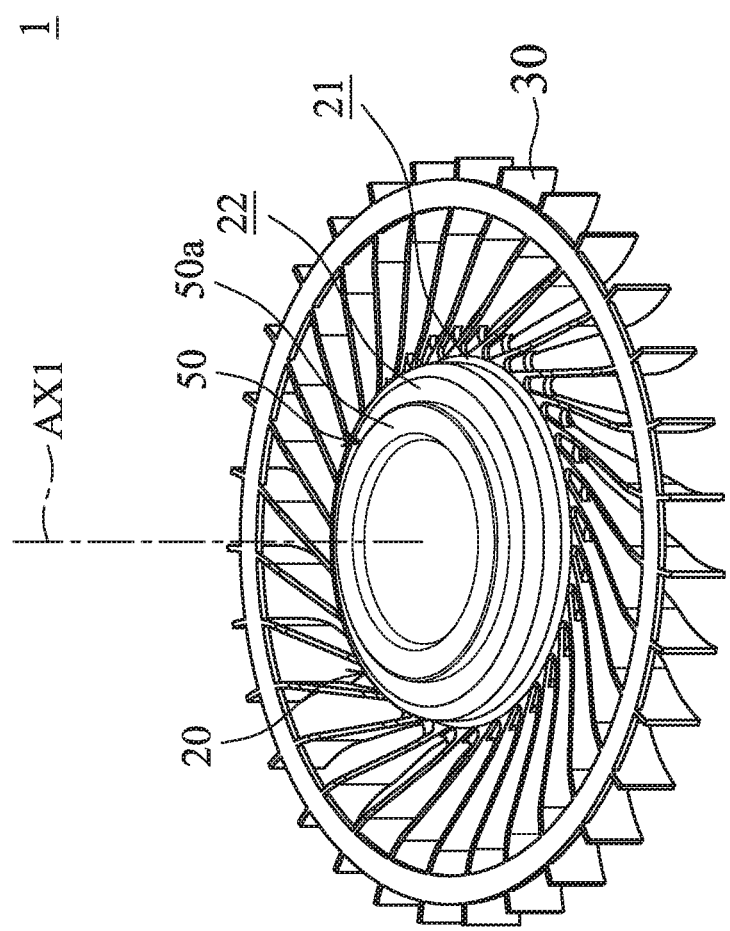
FIG. 5 is a perspective view of the fan in accordance with a second embodiment of the disclosure.

FIG. 5 is a perspective view of the fan 1 in accordance with a second embodiment of the disclosure, wherein the housing 10 is not illustrated in FIG. 5 for clarity. In this embodiment, the balance ring 50 is directly disposed on the top surface 22 of the hub 20. The balance ring 50 can be attached to the top surface of the hub 20 via glue. Therefore, the user can install the balance ring 50 on the existing fan 1 according to the demand, to increase the stability of the existing fan 1.

Figure 6:
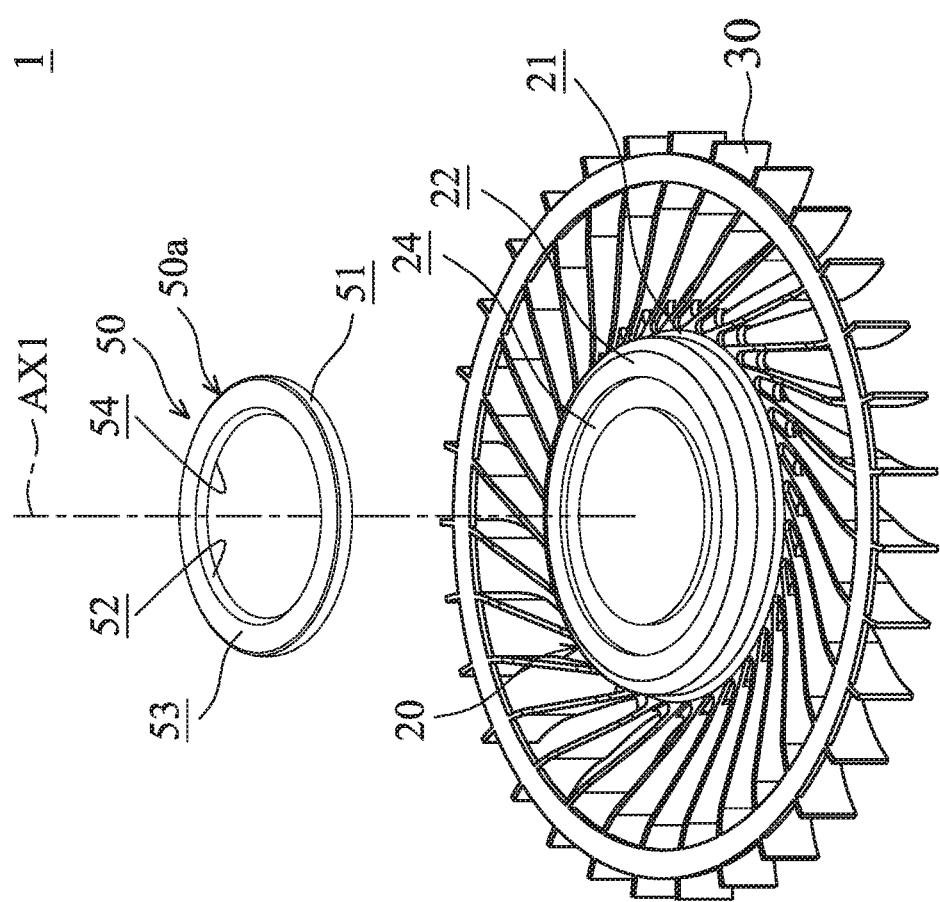
FIG. 6 is a perspective view of the fan in accordance with a third embodiment of the disclosure.

FIG. 6 is a perspective view of a fan 1 in accordance with a third embodiment of the disclosure, wherein the housing 10 is not illustrated in FIG. 6 for clarity. The hub 20 has a retaining groove 24 formed on the top surface 22. The retaining groove 24 may be a ring-shaped, and surround the central axis AX1. In some embodiments, the retaining groove 24 may be a circular. The shape of the retaining groove 24 corresponds to the shape of the balance ring 50. The balance ring 50 is disposed in the retaining groove 24. The retaining groove 24 is configured to restrain the position of the balance ring 50 installing on the top surface 22 of the hub 20.

In some embodiments, the balance ring 50 can be affixed to the retaining groove 24 via glue. In some embodiments, the retaining groove 24 may be formed on the bottom of the drive groove 23 (as shown in FIG. 2). The balance ring 50 can be disposed in the drive groove 23 via the retaining groove 24. Therefore, the user can dispose the balance ring 50 accurately on the hub 20 and increase the stability of the fan 1 by the balance ring 50.

Figure 7:
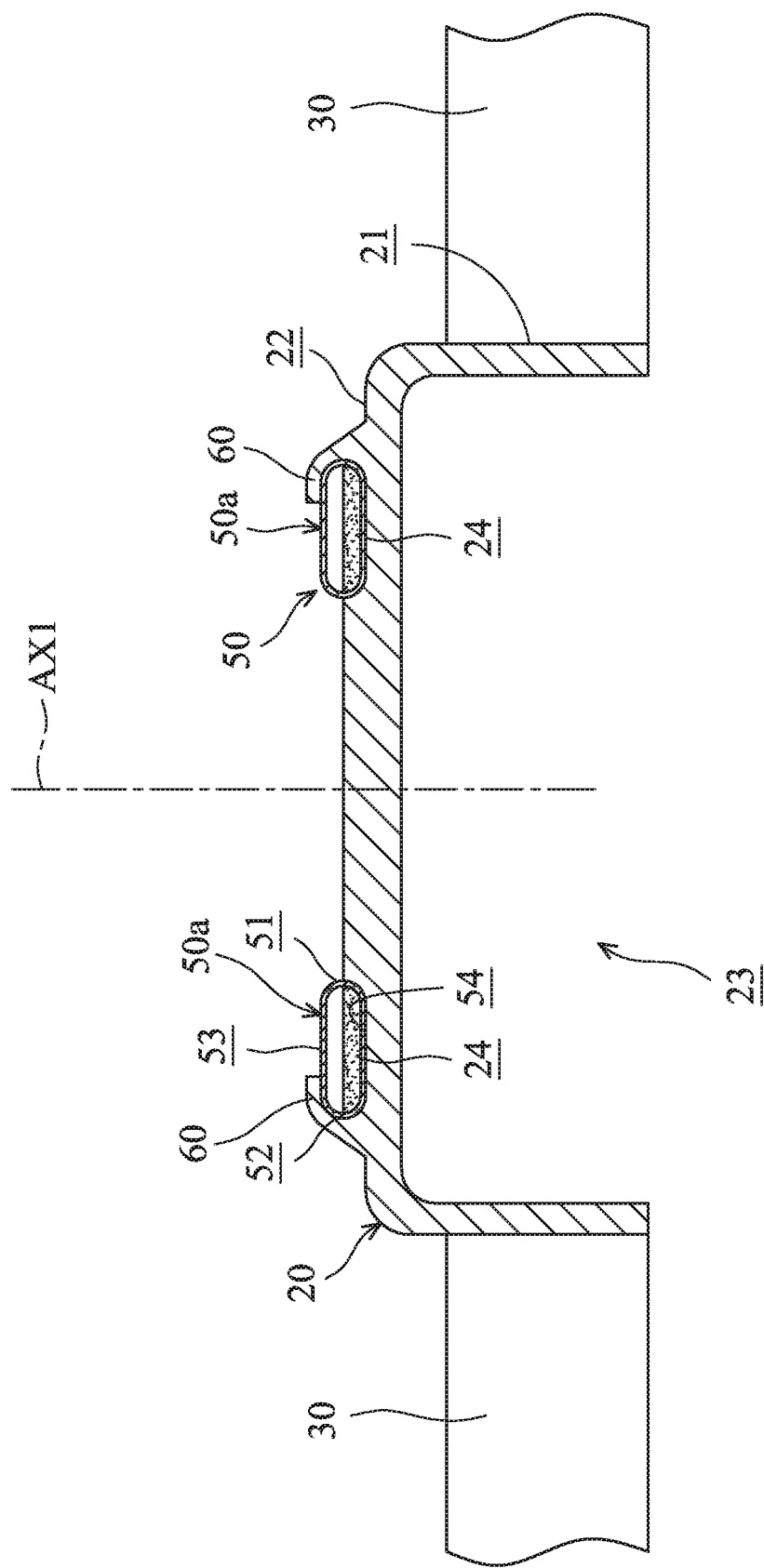
FIG. 7 is a perspective view of the fan in accordance with a fourth embodiment of the disclosure.

FIG. 7 is a perspective view of the fan 1 in accordance with a fourth embodiment of the disclosure, wherein the housing 10 is not illustrated in FIG. 7 for clarity. The hub 20 has a retaining groove 24 formed on the top surface 22. The fan 1 further includes a retaining structure 60 disposed on the top surface 22 of the hub 20. In this embodiment, the balance ring 50 is located in the retaining groove 24, can be retained to the hub 20 via the retaining structure 60. In some embodiments, the hub 20 may not include the retaining groove 24. The hub 20 is disposed on the top surface 22, and is retained on the hub 20 via the retaining structure 60.

In this embodiment, the retaining structure 60 may be a ring-shaped, and surround the central axis AX1. In some embodiments, the retaining structure 60 may be circular. In this embodiment, the retaining structure 60 is in contact with the second outer surface 52. In some embodiments, the retaining structure 60 is in contact with the first outer surface 51. In some embodiments, the retaining structure 60 may be a hook structure.

In some embodiments, the retaining structure 60 is dispose in the drive groove 2323. The balance ring 50 is retained to the drive groove 23 via the retaining structure 60.

Accordingly, the balance ring 50 can be detachably affixed to the hub 20 by the retaining structure 60. The user can install the balance ring 50 on the fan 1 or be removed by the fan 1 as needed.

Figure 8:
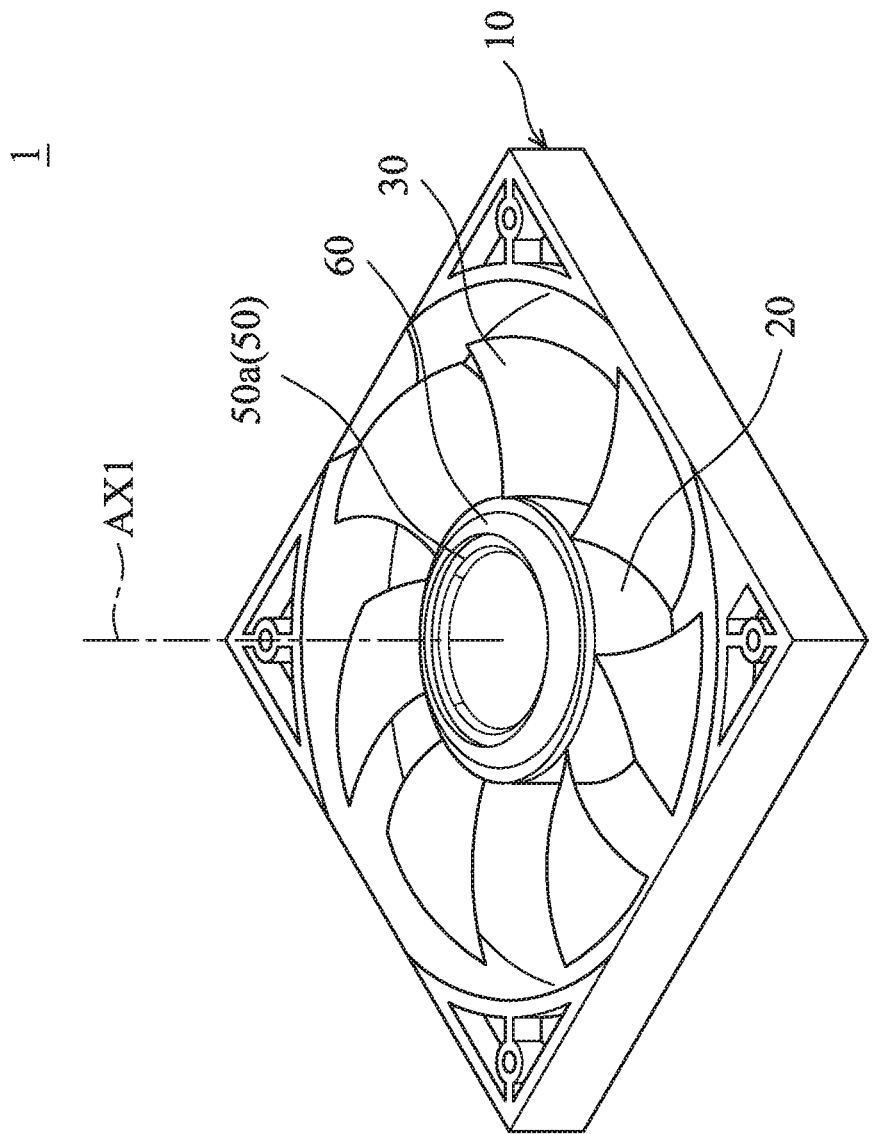
FIG. 8 is a perspective view of the fan in accordance with a fifth embodiment of the disclosure.

FIG. 8 is a perspective view of the fan 1 in accordance with a fifth embodiment of the disclosure. In this embodiment, the fan 1 may be an axial fan. Therefore, the balance ring 50 of the present disclosure can be disposed on the axial fan 1 by any of the described embodiments.

The disclosed features may be combined, modified, or replaced in any suitable manner in one or more disclosed embodiments, but are not limited to any particular embodiments.

In conclusion, the fan of the present disclosure can increase the stability of the fan rotation by the balance ring, thereby reducing the vibration or noise generated by the fan operation.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fan, comprising:
    a housing;
    a hub disposed in the housing, and comprising a side surface, a top surface and a drive groove, wherein when the hub is rotated, the hub is rotated about a central axis, and the central axis passes through the top surface and the drive groove;
    a plurality of blades connected to the side surface;
    a balance ring detachably connected to the hub, and comprising a ring chamber surrounding the central axis and filling with balance liquid, wherein a volume of the balance liquid is less than a volume of the ring chamber; and
    a retaining structure disposed on the hub, wherein the retaining structure is ring-shaped, wherein the retaining structure makes continuous contact with the balance ring around the central axis.

2. The fan as claimed in claim 1, wherein the balance ring is disposed in the drive groove.

3. The fan as claimed in claim 1, wherein the balance ring is disposed on the top surface.

4. The fan as claimed in claim 3, wherein the hub comprises a retaining groove formed on the top surface, and the balance ring is disposed in the retaining groove.

5. The fan as claimed in claim 1, further comprising retaining structure disposed on the hub, and the balance ring is retained on the hub via the retaining structure.

6. The fan as claimed in claim 1, wherein a greatest diameter of the hub is 1 time to 1.3 times a greatest diameter of the balance ring, and a greatest thickness of the hub is 1 time to 8 times a greatest thickness of the balance ring.

7. The fan as claimed in claim 1, wherein the balance ring and the ring chamber are circular, and the balance ring and the ring chamber extends along the same circular path.

8. The fan as claimed in claim 1, wherein the ring chamber comprises a first curved surface and a second curved surface opposite to the first curved surface.

9. The fan as claimed in claim 8, wherein the cross sections of the first curved surface and the second curved surface are semi-circular.

10. The fan as claimed in claim 8, wherein the ring chamber comprises a top plane and a bottom plane opposite to the top plane, and the top plane and the bottom plane are connected to the first curved surface and the second curved surface.

11. The fan as claimed in claim 1, wherein the volume of the balance liquid is 0.2 times to 0.8 times the volume of the ring chamber.

12. The fan as claimed in claim 1, wherein the balance ring comprises plastic.

13. The fan as claimed in claim 1, wherein the balance liquid comprises hydrofluoroether.

14. The fan as claimed in claim 1, wherein, the balance liquid has a surface tension coefficient, which is less than 50 dyne/cm at 20° C.

15. A balance ring for a fan, detachably connected to a retaining structure having a ring shape, wherein the retaining structure makes continuous contact with the balance ring around a central axis, comprising:
    a sealing body comprising a ring chamber and a balance liquid filled in the ring chamber, wherein a volume of the balance liquid is less than a volume of the ring chamber.

16. The balance ring as claimed in claim 15, wherein the sealing body and the ring chamber are circular, and the sealing body and the ring chamber extends along the same circular path.

17. The balance ring as claimed in claim 15, wherein the ring chamber comprises a first curved surface and a second curved surface opposite to the first curved surface.

18. The balance ring as claimed in claim 17, wherein the cross sections of the first curved surface and the second curved surface are semicircular.

19. The balance ring as claimed in claim 17, wherein the ring chamber comprises a top plane and a bottom plane opposite to the top plane, and the top plane and the bottom plane are connected to the first curved surface and the second curved surface.

20. The balance ring as claimed in claim 15, wherein the volume of the balance liquid is 0.2 times to 0.8 times the volume of the ring chamber.

21. The balance ring as claimed in claim 15, wherein the balance ring comprises plastic.

22. The balance ring as claimed in claim 15, wherein the balance liquid comprises hydrofluoroether.

23. The balance ring as claimed in claim 15, wherein the balance liquid has a surface tension coefficient, which is less than 50 dyne/cm at 20° C.

\* \* \* \* \*